United States Patent [19]

Su et al.

[11] Patent Number: 5,693,551
[45] Date of Patent: Dec. 2, 1997

[54] METHOD FOR FABRICATING A TRI-STATE READ-ONLY MEMORY DEVICE

[75] Inventors: Kuan-Cheng Su, Taipei; Chen-Hui Chung, Hsinchu Hsien; Yi-Chung Sheng, Taichung, all of Taiwan

[73] Assignee: United Microelectronics, Corporation, Hsinchu, Taiwan

[21] Appl. No.: 530,575

[22] Filed: Sep. 19, 1995

[51] Int. Cl.⁶ .................................. H01L 21/8246
[52] U.S. Cl. .................. 437/48; 437/45; 437/52
[58] Field of Search .................. 437/52, 48, 45

[56] References Cited

U.S. PATENT DOCUMENTS

| | | | |
|---|---|---|---|
| 5,429,974 | 7/1995 | Hsue et al. | 437/48 |
| 5,449,632 | 9/1995 | Hong | 437/48 |
| 5,545,580 | 8/1996 | Sheng et al. | 437/48 |

*Primary Examiner*—Jey Tsai
*Attorney, Agent, or Firm*—Fish & Richardson P.C.

[57] ABSTRACT

A tri-state read-only memory device and its fabrication method are disclosed herein. After a plurality of word lines are formed and spaced apart in parallel through patterning by a shielding layer, insulating blocks are formed to fill the trenches among the word lines. Then removing the shielding layer, sidewalls of the insulating blocks are revealed, and spacers are formed on the sidewalls thereof. The spacers above the first state regions are removed to form the conductive width of the channel regions in three forms. By merely applying one code-implantation, the ROM device are coded into on of three states at the same time. In addition, the disposition of the insulating blocks by liquid-phase deposition prevents the misalignment that often occurs with the conventional method.

12 Claims, 6 Drawing Sheets

METHOD FOR FABRICATING A TRI-STATE READ-ONLY MEMORY DEVICE

BACKGROUND

1. Field of the Invention

The present invention generally relates to IC (integrated circuits) fabrication techniques, More particularly, the present invention relates to a tri-state read-only memory (ROM) device and a method for fabricating the same by merely using one code-implantation procedure.

2. Technical Background

ROM's (read-only memory) are widely used semiconductor integrated circuit (IC) memory storage devices for digital electronic equipment, in particular, microprocessor-based computer systems, to store predetermined programs. In a conventional semiconductor ROM device, the channel region of a memory cell is selectively implanted with ions to adjust the threshold voltage thereof depending on whether the programmed memory cell is turned on or turned off for representing a logic "1" or a logic "0" in binary, respectively. Conventional ROM IC devices, therefore, store a single binary bit in each of their memory cells. Then, conventional digital circuitry in ROM's employ sense amplifiers to sense the content of an addressed memory cell for "reading." However, the sensed result with respect to each memory cell within the ROM is identified as one of two possible electrical potential states. In other words, the memory content of a ROM memory cell as read is either a logic "1" or a logic "0."

The trend in the semiconductor industry has been to increase the number of memory cells to increase the storage capacity of a semiconductor integrated circuit chip, as well as reducing the size of the semiconductor device itself. Enlarged memory capacity and reduced memory semiconductor die size represent increased functionality and reduced cost, both of which are desirable qualities from a merchandising point of view. Great effort has been expended in the art of semiconductor chip manufacture to reduce the dimensions of semiconductor devices in order to squeeze more memory cells into the same semiconductor die area. This approach, however, is limited by the resolution available according to the current state of fabrication techniques.

Increasing the number of states to which a memory cell can correspond is a practicable means for overcoming present limitations. Consequently, a tri-state read-only memory is set forth, whose threshold voltage is adjusted through ion implantation with different dosages to be, for example, 5V, 2.5V, or 0.8V, to have logic states designated as "1", "-", or "0", respectively. Referring to FIGS. 1 and 2A–C, the top view of a conventional tri-state read-only memory device is depicted. Numerals 10 represent bit lines formed in a substrate 20 spaced in parallel along a first direction 100. Numerals 12 represent word lines striding over the bit lines 10 mutually spaced in parallel along a second direction 102, having dielectric layers 21 (which are further described later) therebelow for isolating them from the substrate. Two adjacent bit lines 10 and a word line 12 striding over them constitute the source/drain regions and gate electrode of a MOS transistor, respectively. The channel region of the MOS transistor for carrier transport is formed between the source/drain regions. Numerals 14 and 16 mark the channel regions for storing a first state. Numeral 18 marks the channel region for storing a second state, and the remaining channel regions act as the regions for storing a third state.

Now referring to FIGS. 2A–2C, the process flow of the tri-state read only memory shown in FIG. 1 is depicted. These drawings are shown in cross-sectional views taken on a line A—A' shown FIG. 1.

The conventional tri-state ROM device is fabricated on a semiconductor substrate 20. First, impurities are implanted into substrate 20 to form a plurality of bit lines 10 mutually spaced in parallel (as shown in FIG. 1). For example, the semiconductor 20 can be either an P-type or N-type silicon substrate, while the implanted impurities for forming the bit lines 10 are of either N-type or P-type, respectively. If P-type silicon substrate is used, phosphoric or arsenic ions are utilized to form the bit lines 10. Next, as shown in FIG. 2A, thermal oxidation or deposition of the substrate 20 forms an oxide layer, and then a polysilicon layer is deposited on the oxide layer. Afterwards, the polysilicon layer and the oxide layer are subsequently etched and patterned into word lines 12 and dielectric layers 21, respectively. Also, the above-mentioned polysilicon can be doped with impurities so as to increase the conductivity thereof.

Then, as shown in FIG. 2B, a first code-masking layer 200 is formed to cover the substrate 20 but expose the regions for storing the first state, such as regions 14 and 16. The first code-masking layer 200 is formed by photolithography steps consisting of coating photoresist, alignment, exposure, developing, and rinsing. Through the shielding of the first code-masking layer 200, impurities 22 are implanted through the exposed regions 14 and 16 into the substrate 20 to form a first state region 23.

After that, the first code-masking layer 200 is removed. As shown in FIG. 2C, a second code-masking layer 202 is formed to cover the substrate 20 while exposing the region for storing the second state, such as the region 18. Through the shielding of the second code-masking layer 202, impurities 24 are implanted through the region 18 into the substrate 20 therefore to form a second state region 25. Since the impurities 24 being implanted at a dosage lower than the aforementioned implanted impurities 22, therefore the threshold voltage of the first and second state regions 23 and 25 are adjusted to different levels, such as 5V and 2.5V, respectively. Moreover, the remaining regions not subjected to any code-implantation procedures are the regions for storing the third state, as exemplified, a third state region 26 depicted in FIG. 2C.

As described above, the conventional tri-state ROM device is programmed through multiple ion implantation procedures so as to code each of the memory cells corresponding to one of the first, second or third states. In such way, a memory cell can store data in tri-state instead of in binary.

Unfortunately, those code-masking layers patterned through photolithography may suffer from misalignment occurring to shift somewhat and overlap the adjacent regions not storing the same state. This affects the data accuracy of the memory cells. Worse than this, the ROM device is caused to fail, thereby decreasing the product yield.

SUMMARY

It is therefore an object of the present invention to provide a tri-state read only memory device and its fabrication method without suffering from misalignment shortcomings.

It is another object of the present invention to provide a tri-state read only memory device and its fabrication method for programming the memory cells by merely one code-implantation procedure.

The present invention concerns a method for fabricating a tri-state read-only memory device that satisfies the aforementioned objects. The method is suited to a semiconductor substrate. First of all, a plurality of first conducting lines are formed to be spaced in parallel in the substrate and then a dielectric layer is formed on the substrate. Subsequently, a conducting layer and a shielding layer are formed on the dielectric layer. By utilizing the shielding layer as masking, the conducting layer is etched and patterned into a plurality of second conducting lines spaced in parallel, shaping a trench between each two of the second conducting lines. After that, insulating blocks are individually formed to fill into the trenches. Next, sequential steps consisting of removing the shielding layer exposing sidewalls of the insulating blocks, forming sidewall spacers on the sidewalls of the insulating blocks are performed. Afterwards, a first masking layer is formed over the substrate, and a part of the sidewall spacers not covered by the first masking layer is removed. Through the above steps, the first masking layer is removed and then a second masking layer is formed over the substrate. Finally, the substrate is subjected to a code implantation by utilizing the second masking layer as shielding therefore to form first, second and third state regions.

Furthermore, the present invention is directed to a tri-state read only memory device for storing first, second and third states that satisfies the aforementioned objects. The read only memory device is disposed on a semiconductor substrate. A plurality of bit lines are spaced in parallel and formed in the substrate. A plurality of word lines are spaced in parallel and formed over the substrate, having a dielectric layer disposed therebetween. Moreover, a plurality of channel regions are disposed between each two of the bit lines and below the word lines for storing the first, second, and third states, respectively, wherein the channel regions for storing the first state are all operated in an OFF-state, the channel region for storing the second state are operated in an OFF-state in the central portion, and the channel regions for storing the third state are operated in an ON-state.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENT

Figure 4:
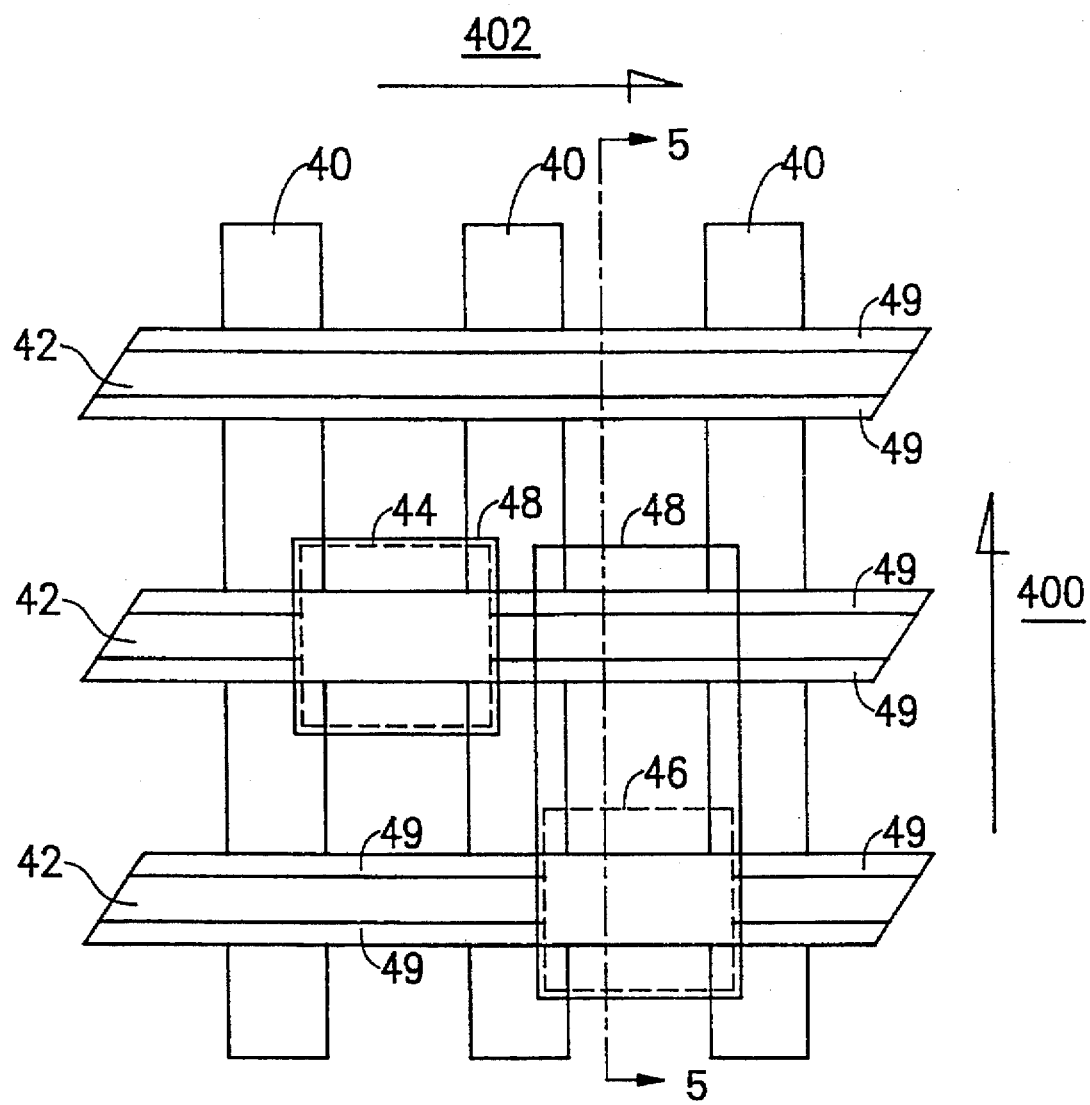
FIG. 4 depicts the top view of one preferred embodiment in accordance of the present invention.

Referring to FIG. 4, the top view of one preferred embodiment in accordance with the present invention is depicted. In the drawing, numerals 40 are bit lines formed along a first direction 400 in a semiconductor 50 (to be shown below), and numeral 42 are word lines are formed along a second direction 402 striding over the bit lines 40. A dielectric layer 51 (to be described below) is respectively formed below the word lines 42 for isolating the word lines 42 from the underlying substrate 50. Therefore, two adjacent bit lines 40 and a word line 42 striding over them constitute the source/drain regions and gate electrode of a MOS transistor comprising memory cell. The channel region of the MOS transistor for carrier transport is formed between the source/drain regions for storing one of a first state, a second state, and a third state. Numerals 44 and 46 mark the channel regions for storing the first state. Numerals 48 mark the regions including the channel regions for storing the first and second states, and the remaining channel regions act for storing a third state. Spacers 49 are formed on the opposite sides of the word lines 42 with the exception of the range within the regions 44 and 46.

Figure 5A:
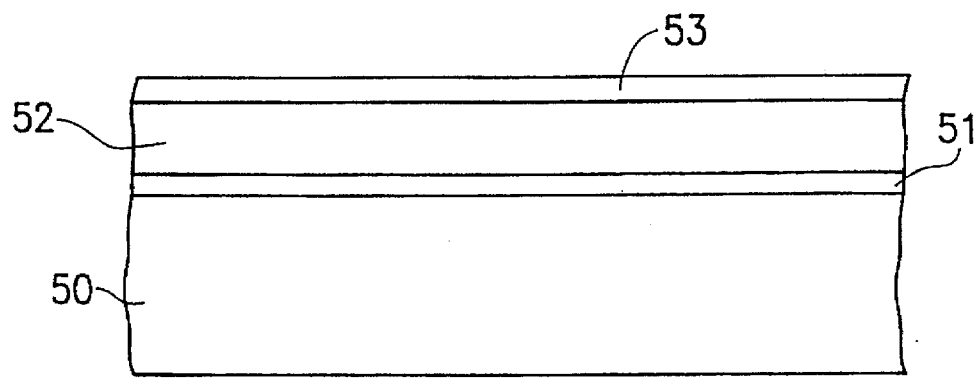
FIGS. 5A–5E depict the process flow of one preferred embodiment in cross-sectional views taken along a line B—B' of FIG. 4.

Next, referring to FIGS. 5A–5E, the process flow of one preferred embodiment, in cross-sectional views taken along a line B—B' of FIG. 4, is depicted. The preferred embodiment is suited to fabricating a ROM device on a semiconductor substrate 50, such as a P-type or N-type silicon substrate. If the preferred embodiment makes use of a P-type silicon substrate as exemplified, N-type impurities, such as phosphoric or arsenic ions, are utilized to implant into substrate 50 forming a plurality of first conducting lines 40 as bit lines (as shown in FIG. 4). Then, as shown in FIG. 5A, thermal oxidation or deposition to the substrate 50 forms a oxide layer serving as a dialectic layer 51. Subsequently, a conducting layer 52 is formed on the dielectric layer 51. For example, a doped polysilicon layer is low-pressure-chemical-vapor deposited (LPCVD) on the dielectric layer 51 constituting the conducting layer 52, having a thickness of from about 1000Å to about 4000Å. In order to increase the selectivity while forming spacers 49 in the following steps, a silicon oxide layer 53 is optionally deposited over the conducting layer 52.

Moreover, a shielding layer 500 with designated word-line patterns is formed atop the stacked layer shown in FIG. 5A. However, the shielding layer 500 can be a photoresist layer formed by sequential steps consisting of coating photoresist, exposure, development, rinse, and so on. Then, by utilizing the shielding layer 500 as masking, the conducting layer 52 is etched and patterned to the word lines 42 spaced apart in parallel to expose a portion of dielectric layer 51. Meanwhile, trenches 502 are revealed among the word lines 42 shown in FIG. 5B.

Figure 1:
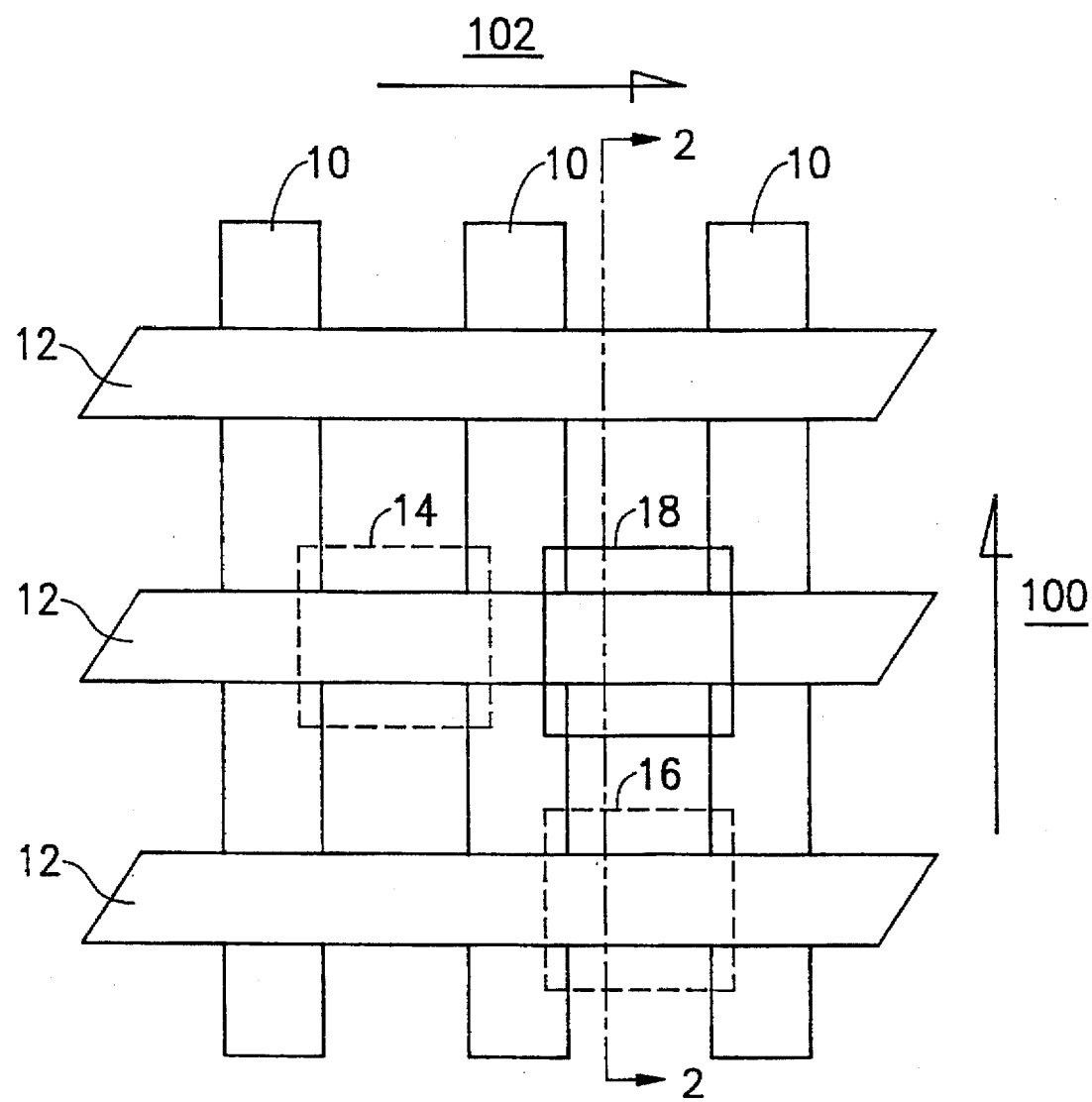
FIG. 1 depicts the top view of a conventional tri-state ROM device.
Figure 2A:
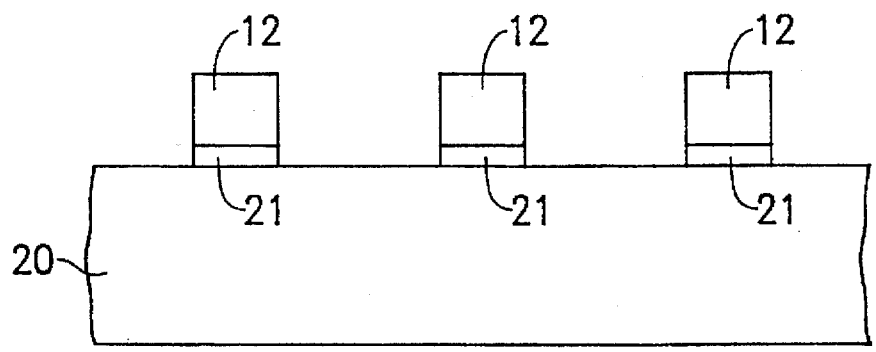
FIGS. 2A–2C depict the process flow of the conventional ROM device in cross-sectional views taken along a line A—A' of FIG. 1.
Figure 2B:
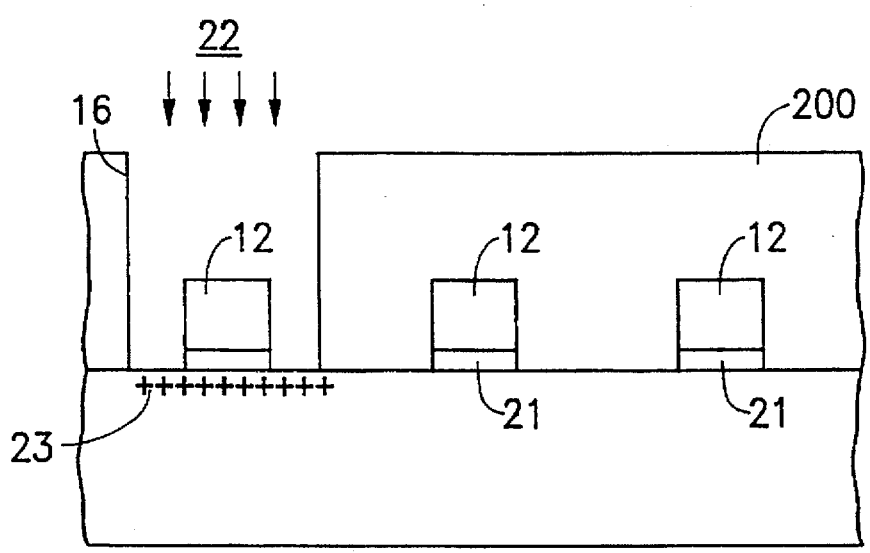
Figure 2C:
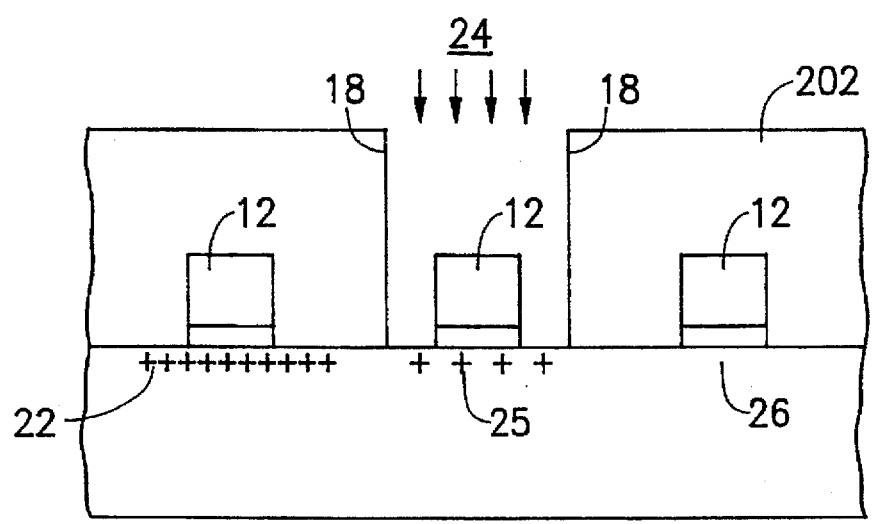
Figure 3:
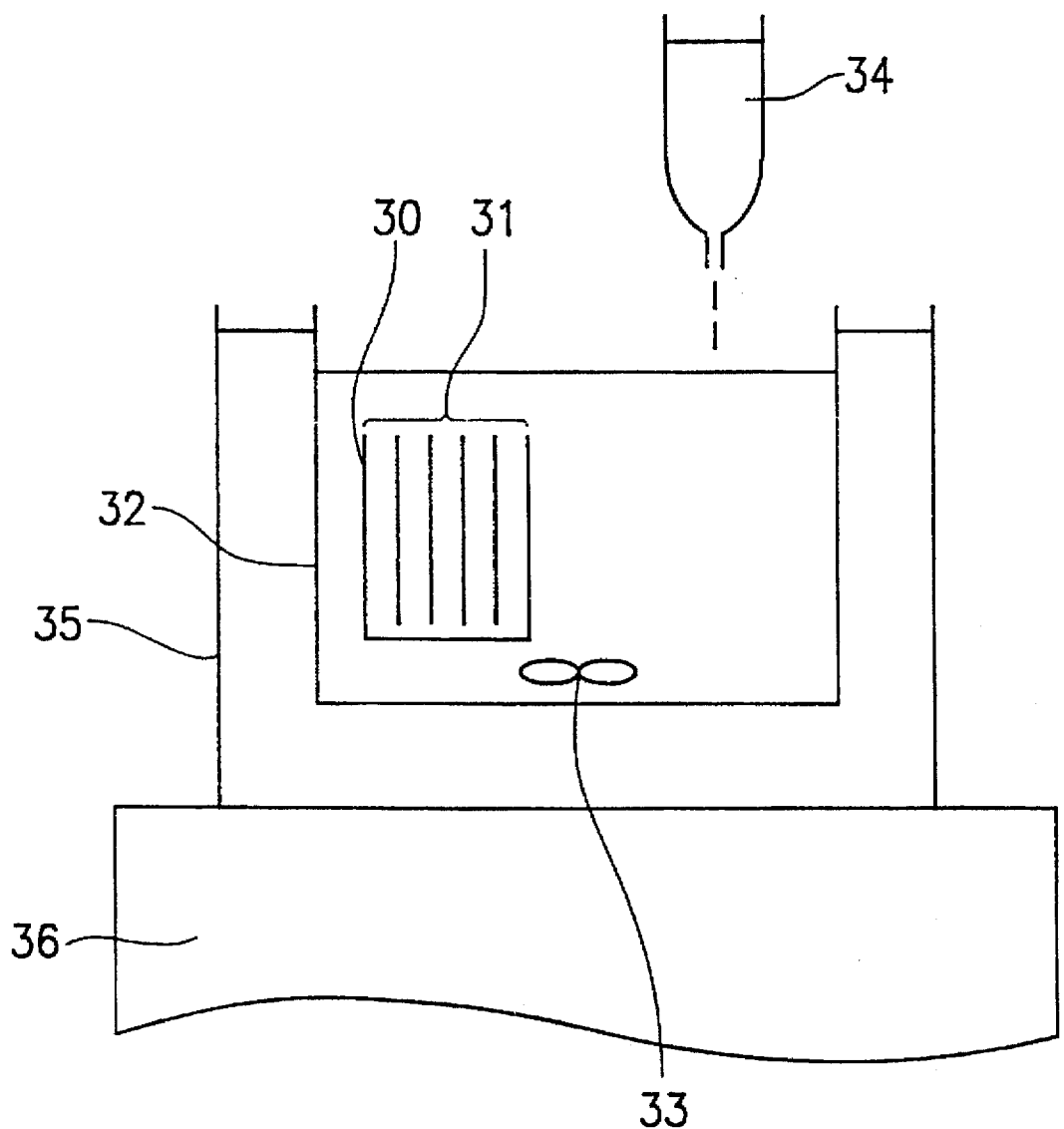
FIG. 3 schematically depicts a liquid-phase deposition apparatus.
Figure 5B:
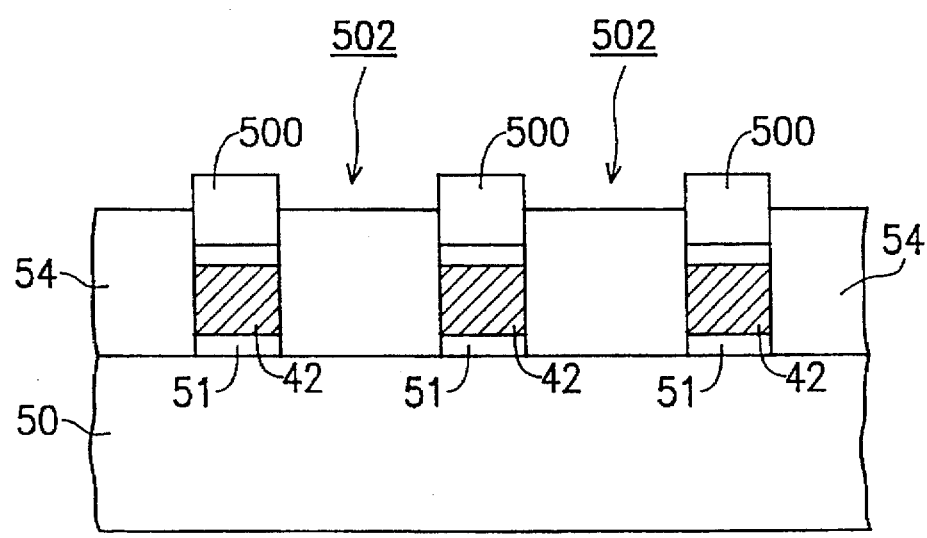

The substrate 50 is next placed in a liquid phase deposition (LPD) apparatus as shown in FIG. 3, to form insulating blocks 54 that fill trenches 502. The liquid phase deposition apparatus includes a reactor 32 containing hydrofluosilicic acid ($H_2SiF_6$) as reactant, a carrier 30 placed in the reactor 32 for holding silicon wafer 31, a stirrer 33 for stirring the reactant, an injector 34 to add boric acid ($H_3BO_3$) into the reactor 32 to keep the hydrofluosilicic acid saturated, a water bath 35, and a temperature controlled heater 36, which maintains the temperature of the water bath 35 between 33° C. and 37° C. The hydrofluosilicic acid ($H_2SiF_6$) is saturated with $SiO_2$ powder. Liquid phase deposition of $SiO_2$ is described in the paper entitled "A SELECTIVE $SiO_2$ FILM-FORMATION TECHNOLOGY USING LIQUID-PHASE DEPOSITION FOR FULLY PLANARIZED MULTI-LEVEL INTERCONNECTIONS," J. Electrochem. Soc., Vol. 140, No. 8, August 1993, pp. 2411–2414. Since the liquid phase deposition apparatus has relatively high deposition selectivity, insulating blocks 54 (which are made of silicon oxides) are only deposited on the exposed dielectric layer 51 to fill the trenches 502 (i.e., not on shielding layer 500). According to the method of the invention, the insulating blocks 54 should have a height that extends between the top surface and the bottom surface of the shielding layer 500. In FIG. 5B, the exposed dielectric layer 51 is incorporated with insulating blocks 54, and they both are made of silicon oxides.

Figure 5C:
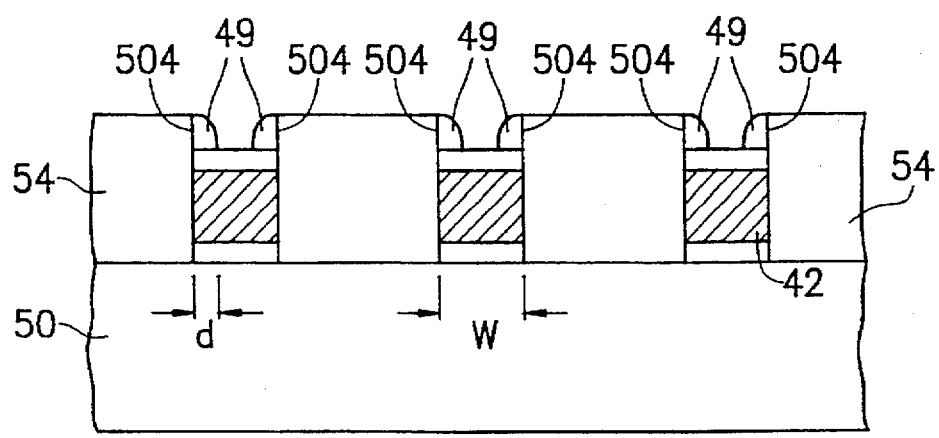

Furthermore, as shown in FIG. 5C, the shielding layer 500 is removed to reveal sidewalls 504 of the insulating blocks 54, and then the spacers 49 are formed on the sidewalls 504. The formation of the spacers 49 is performed by depositing a silicon nitride layer on the substrate's surface, and etching back the silicon nitride layer into spacers 49 on the sidewalls 504. Preferably, each of the spacers has a width d ranging from ⅓ W to ⅙ W while the width of the word lines 42 is W. More preferably, the width d is about ¼ W.

Figure 5D:
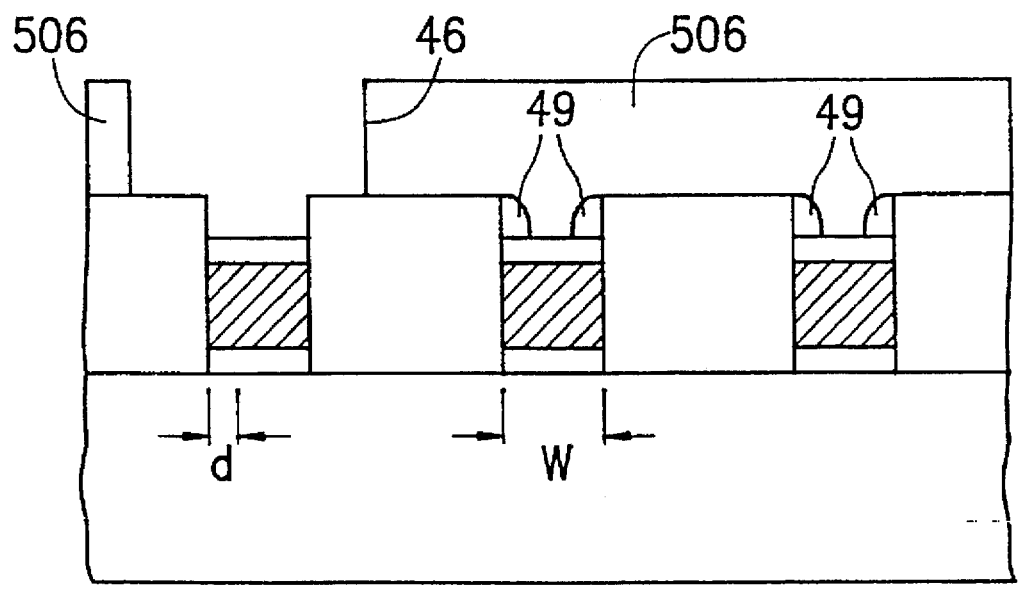

Then, referring to FIG. 5D, a first masking layer 506 is formed over the substrate 50 to expose the regions for storing the first state, such as regions 44 and 46. After that, parts of spacers 49 not covered by the first masking layer 506 are removed, that is, the spacers 49 within the regions 44 and 46 are removed.

Figure 5E:
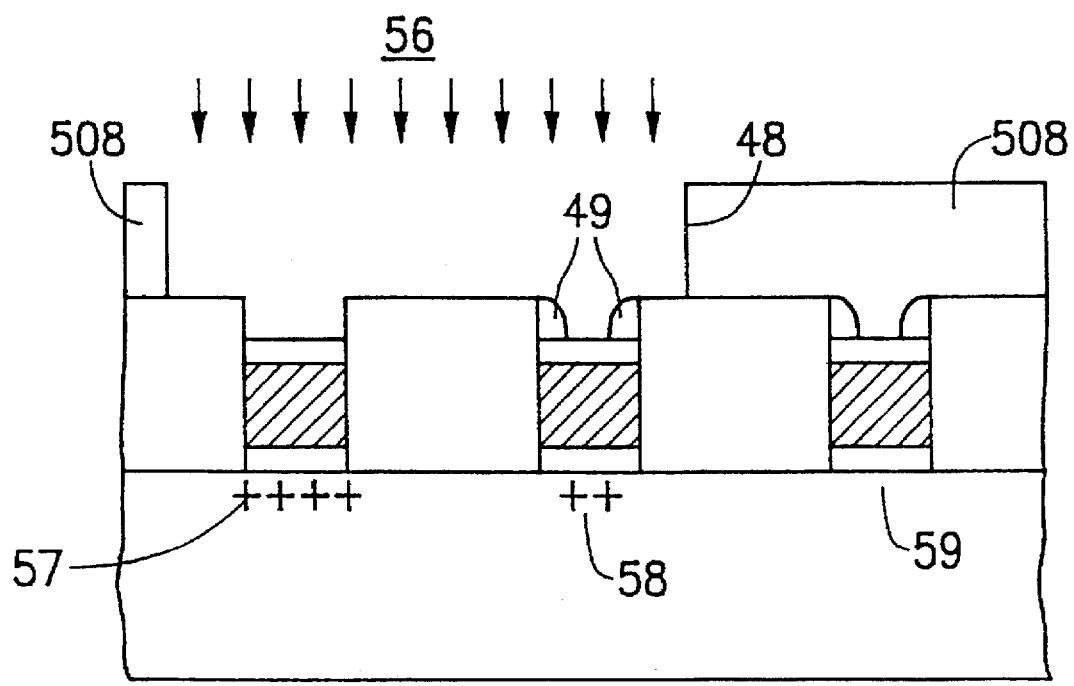

Afterwards, the first masking layer 506 is removed. As depicted in FIG. 5E, a second masking layer 508 is formed on the substrate 50 to expose regions 48. However, the regions 48 are the channel regions including the first and second state. Then, impurities 56 are implanted into the substrate 50 to form a first state region 57, a second state region 58, and a third state region 59 at the same time. The implanted impurities 56 are performed by using boron-containing ions, such as $B^+$ or $BF_2^+$, at a dosage of about 1E13-5E14cm$^{-2}$ with an energy of about 40-160 KeV. Since there is no shielding of the spacers 49 above the first state region 57, the implanted impurities 56 are diffused into the overall channel region to constitute an OFF state. However, the second state region 58 is formed by utilizing the spacers thereabove as masking, and therefore the implanted impurities 56 are merely diffused into about ⅓–⅔ of the channel width W, the remaining channel below the spacers 49 is still conductive. In another word, the second state region 58 is either partially ON or partially OFF. Moreover, the third state region 59 shielded by the second masking layer 508, the overall channel of which is conductive, is in an ON state. In this way, tri-state coding is achieved because the current flow of a memory cell is proportional to the width of the conductive channel thereof.

In conclusion, the present invention makes use of a liquid-phase deposition process to form insulating blocks filling trenches among the word lines. Further, since spacers are disposed at opposite sides of the word line above the second state region, one code-implantation is required to code memory cells into one of three states. The spacers are employed to adjust the conductive width of the channel to make an intermediate state between an ON-state and an OFF-state. Moreover, the use of liquid-phase deposition can prevent the occurrence of the misalignment.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method for fabricating a tri-state read only memory device, comprising:

providing a semiconductor substrate;

forming a plurality of first conducting lines spaced in parallel in said substrate;

forming a dielectric layer on said substrate;

forming a conducting layer on said dielectric layer;

forming a shielding layer with predetermined patterns on said conducting layer;

etching and patterning said conducting layer into a plurality of second conducting lines spaced in parallel by utilizing said shielding layer as masking, and shaping a trench between each two of said second conducting lines;

forming insulating blocks individually filling said trenches;

removing said shielding layer exposing sidewalls of said insulating blocks;

forming sidewall spacers on said sidewalls of said insulating blocks;

forming a first masking layer over said substrate;

removing a part of said sidewall spacers not covered by said first masking layer;

removing said first masking layer;

forming a second masking layer over said substrate; and subjecting said substrate to a code implantation by utilizing said second masking layer as shielding to form first, second and third state regions.

2. The method as in claim 1, wherein each of said sidewall spacers has a width ranging from about ⅙ to about ⅓ of the width of said second conducting lines.

3. The method as in claim 1, wherein said insulating blocks are made of silicon oxides formed by a liquid-phase deposition procedure.

4. The method as in claim 1, wherein said shielding layer is a photoresist layer patterned by a photolithography procedure to have said predetermined patterns.

5. The method as in claim 1, wherein said dielectric layer is made of silicon oxides.

6. The method as in claim 1, further comprising a silicon oxide layer formed atop said conducting layer.

7. The method as in claim 1, wherein said conducting layer is made of polysilicon.

8. The method as in claim 1, wherein said first conducting layers are doped regions formed by implanting impurities into said substrate.

9. The method as in claim 1, wherein the step for forming said sidewall spacers comprises:

forming a silicon nitride layer overlying said substrate; and etching back said silicon nitride layer forming said sidewall spacers.

10. The method as in claim 1, wherein said first masking layer is a photoresist layer.

11. The method as in claim 1, wherein said second masking layer is a photoresist layer.

12. The method as in claim 1, wherein said second conducting lines stride across said conducting lines at an almost orthogonal angle.

* * * * *